(12) United States Patent
Yamadate

(10) Patent No.: US 6,365,914 B1
(45) Date of Patent: Apr. 2, 2002

(54) SEMICONDUCTOR DEVICE PROVIDED WITH A BUILT-IN MINUTE CHARGE DETECTING CIRCUIT

(75) Inventor: Masaaki Yamadate, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/954,059

(22) Filed: Sep. 18, 2001

(30) Foreign Application Priority Data

Sep. 18, 2000  (JP) ........................................ 2000-281720

(51) Int. Cl.[7] ............................................. H01L 23/58
(52) U.S. Cl. ................. 257/48; 324/123 R; 324/123 C; 324/124
(58) Field of Search ..................... 257/48; 324/123 R, 324/124, 123 C

(56) References Cited

U.S. PATENT DOCUMENTS

| | | | | |
|---|---|---|---|---|
| 4,532,442 A | * | 7/1985 | Black | |
| 5,365,055 A | * | 11/1994 | Decker et al. | 250/214 R |
| 5,543,728 A | * | 8/1996 | Grace et al. | 324/763 |
| 5,838,241 A | * | 11/1998 | Lease et al. | 340/618 |
| 6,070,257 A | * | 5/2000 | Takahashi | 714/724 |

FOREIGN PATENT DOCUMENTS

JP         A5858479         4/1983

* cited by examiner

Primary Examiner—Ngân V. Ngô

(57) ABSTRACT

A semiconductor device has a minute charge detecting circuit and a test circuit for suppressing harmful influence of stray capacitance and external noises during detection of a minute electric charge. The minute charge detecting circuit is constructed of a differential amplifier, a charge detecting capacitance and a charge-discharging switch. The test circuit is constructed of a charge transforming capacitance, a first switch and a second switch. A voltage variation of an input voltage signal for giving the minute electric charge is determined on the basis of a capacitance ratio of the charge transforming capacitance to the charge detecting capacitance. By making a capacitance value of the charge transforming capacitance smaller than that of the charge detecting capacitance, the voltage variation is increased so that the harmful influence of stray capacitance and external noises is reduced.

5 Claims, 7 Drawing Sheets

US 6,365,914 B1

SEMICONDUCTOR DEVICE PROVIDED WITH A BUILT-IN MINUTE CHARGE DETECTING CIRCUIT

BACKGROUND OF THE INVENTION

The present invention relates to a semiconductor device provided with a built-in minute charge detecting circuit.

Conventionally, there has been a semiconductor device provided with a built-in minute charge detecting circuit for detecting a minute electric charge. When inspecting this semiconductor device, a minute charge generating circuit that serves as an input signal source is arranged near an input terminal of the semiconductor device so as to make an input signal less susceptible to influence of stray capacitance, external noises and the like. An output signal of the minute charge detecting circuit is measured with a minute electric charge given as a signal directly to the input terminal so as to measure the gain, the signal-to-noise ratio or the like of the minute charge detecting circuit.

FIG. 7 shows a semiconductor device 40 with the built-in minute charge detecting circuit and a minute charge generating circuit 50 for inspecting the semiconductor device. As shown in FIG. 7, this semiconductor device has a differential amplifier OP, a charge detecting capacitance C1, a charge-discharging witch SW1 and a processing circuit 44. An inverted input terminal of the differential amplifier OP is connected to an input terminal 41 and a non-inverted input terminal of the differential amplifier OP is connected to a ground GND. The charge detecting capacitance C1 is connected across an output terminal of the differential amplifier OP and the inverted input terminal of the differential amplifier OP. The charge-discharging switch SW1 is connected across the output terminal the differential amplifier OP and the inverted input terminal of the differential amplifier OP. The processing circuit 44 processes an output voltage outputted from the differential amplifier OP. The differential amplifier OP, the charge detecting capacitance C1 and the charge-discharging switch SW1 constitute a minute charge detecting circuit 43.

The semiconductor device 40 shown in FIG. 7 is inspected by inputting an electric charge generated in the minute charge generating circuit 50 to the input terminal 41 of the semiconductor device 40. An electric charge Q accumulated when a voltage V is applied to the capacitance C is expressed by:

$$Q = C \times V.$$

Therefore, assuming that an electric charge accumulated in the charge detecting capacitance C1 of the minute charge detecting circuit 43 is Q1, then an output voltage Vo becomes:

$$Vo = Q1/C1,$$

and the output voltage Vo of the minute charge detecting circuit 43 is inversely proportional to the charge detecting capacitance C1. Therefore, unless the capacitance value of the charge detecting capacitance C1 is reduced, the output voltage Vo becomes a minute voltage since the electric charge Q1 is a minute charge. As a result, the measurement error increases. For the above reasons, the charge detecting capacitance C1 of the minute charge detecting circuit 43 is required to have a minute capacitance value of about several picofarads.

Accordingly, when inspecting the minute charge detecting circuit 43, a stray capacitance added to the input terminal 41 emerges as a disadvantage. Specifically, if an input stray capacitance Cf is added by connecting an input section of the minute charge generating circuit 43 to the input terminal 41 as shown in FIG. 7, then a charge quantity Qf out of the minute charge quantity Q given from the minute charge generating circuit 50 is accumulated in the input stray capacitance Cf. As a consequence, the charge quantity Q1 accumulated in the minute charge detecting capacitance C1 becomes a difference between the input charge quantity Q and the electric charge Qf accumulated in the stray capacitance as expressed by:

$$Q1 = Q - Qf.$$

Since the accumulated electric charge Qf increases when the stray capacitance Cf is increased, the electric charge Q1 becomes significantly reduced from the input charge quantity Q. Therefore, the stray capacitance Cf becomes a factor of a reduction in measurement accuracy.

When inspecting the semiconductor device shown in FIG. 7, it cannot be avoided that the stray capacitance Cf due to wiring is added to the input section of the minute charge detecting circuit 43 even if the minute charge generating circuit 50 is arranged near the minute charge detecting circuit 43 to be measured. Furthermore, in order to connect the minute charge detecting circuit 43 to be measured to the minute charge generating circuit 50 that generates an input signal, it is required to provide a connection by means of a socket or probing. Due to addition of the stray capacitance in the connection, the stray capacitance Cf increases to the extent of several picofarads. For the above reason, the accumulated electric charge Qf increases, which decreases the electric charge Q1 accumulated in the charge detecting capacitance C1 of the minute charge detecting circuit 43. Thereby, there has caused a disadvantage that a measurement error of gain is increased. In order to avoid this disadvantage, it is required to provide a setting of:

$$Cf \ll C1.$$

However, the charge detecting capacitance C1 cannot be increased in the semiconductor device in which the capacitance value of the charge detecting capacitance C1 amounts to several picofarads in order to obtain a sufficient output voltage. Therefore, the measurement accuracy cannot be increased.

Moreover, when a minute electric charge is inputted as an input signal directly to the input terminal, an impedance of the input wiring portion is high with a high impedance of the input terminal and a high impedance of the input minute electric charge. The above state is susceptible to the influence of external noises, which leads to a disadvantage that the measurement becomes unstable.

SUMMARY OF THE INVENTION

An object of the present invention is to provide a semiconductor device capable of improving accuracy in measurement of a minute charge detecting circuit by suppressing influence of stray capacitance, external noises and the like during test.

In order to achieve the aforementioned object, the present invention provides a semiconductor device a semiconductor device comprising: a minute charge detecting circuit for detecting a minute electric charge; and a test circuit provided between an input terminal of the semiconductor device and an input section of the minute charge detecting circuit, the test circuit having: a charge transforming capacitance for transforming a voltage signal inputted from the input terminal into an electric charge, and an operation mode switchover means for switching over between a normal operation mode in which an electric charge inputted to the input terminal is detected by the minute charge detecting circuit and a test operation mode in which the voltage signal inputted to the input terminal is transformed into an electric charge by the charge transforming capacitance and the transformed electric charge is detected by the minute charge detecting circuit.

According to the semiconductor device having the above-mentioned construction, the charge transforming capacitance (capacitor) and the operation mode switchover means are provided between the input section of the minute charge detecting circuit and the input terminal of the semiconductor device, and the charge transforming capacitance eliminates the harmful influence of stray capacitance and external noises added to the input terminal.

Specifically, even if stray capacitance attributed to wiring from an input signal source to the input terminal or stray capacitance due to contact of a socket or a probe is added, a high voltage can be applied as a test signal to the input terminal because of the charge transforming capacitance. Consequently, the electric charge accumulated in the charge detecting capacitance in the minute charge detecting circuit is not reduced by the harmful influence of the stray capacitance, and therefore the gain of the minute charge detecting circuit can be accurately measured.

Moreover, the voltage signal from the input signal source of low output impedance can be used as an input signal, and therefore the impedance of the input signal line can be reduced. This arrangement is less susceptible to the influence of the external noises and allows the measurement value to be stabilized.

Furthermore, the minute charge generating circuit, which requires careful handling due to a signal of a minute electric charge, is built in the semiconductor device, and therefore an external inspection circuit is allowed to have a simple construction.

In one embodiment of the present invention, the operation mode switchover means comprises: a first switch that has one terminal connected to the input terminal and other terminal connected to the input section of the minute charge detecting circuit; and a second switch that has one terminal connected to the charge transforming capacitance and other terminal connected to the input section of the minute charge detecting circuit.

According to the semiconductor of the above-mentioned embodiment, the operation mode switchover means has the first and second switches to easily switch over between the normal operation mode and the test operation mode. In the test operation mode of turning off the first switch and turning on the second switch, the voltage signal inputted to the input terminal is transformed into an electric charge by the charge transforming capacitance, so that the transformed electric charge is detected by the minute charge detecting circuit.

In the semiconductor device of one embodiment, the operation mode switchover means comprises: a first switch that has one terminal connected to the input terminal and other terminal connected to the input section of the minute charge detecting circuit; and a second switch that has one terminal connected to the input terminal and other terminal connected to the charge transforming capacitance.

This embodiment has the same operational advantage as that of the previous embodiment.

In one embodiment of the present invention, the operation mode switchover means comprises: a first switch that has one terminal connected to the input terminal and other terminal connected to the input section of the minute charge detecting circuit; a second switch that has one terminal connected to the input terminal and other terminal connected to the charge transforming capacitance; and a third switch that has one terminal connected to the charge transforming capacitance and other terminal connected to the input section of the minute charge detecting circuit.

According to the semiconductor device of the above-mentioned embodiment, when turning off the first switch and turning on the second and third switches, the voltage signal inputted to the input terminal is transformed into an electric charge by the charge transforming capacitance. The transformed electric charge is detected by the minute charge detecting circuit. Furthermore, input of unnecessary signals are prevented by selectively turning on the second switch under a state that the first switch is turned off and the third switch is turned on only when the voltage signal for test is applied to the input terminal.

In one embodiment of the present invention, the second switch is turned on during a period when an electric charge for test use is given to the minute charge detecting circuit and the second switch is turned off during a period when no electric charge for test use is given to the minute charge detecting circuit in a state that the first and third switches are turned on in the test operation mode.

According to the semiconductor device of the above-mentioned embodiment, the second switch is turned on during the period under the state that the first and third switches are turned on when the electric charge for test use is given to the minute charge detecting circuit. In contrast, the second switch is turned off during the period when the electric charge for test use is not given to the minute charge detecting circuit. The above operation enables removal of the noises of the voltage signal during inspection.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
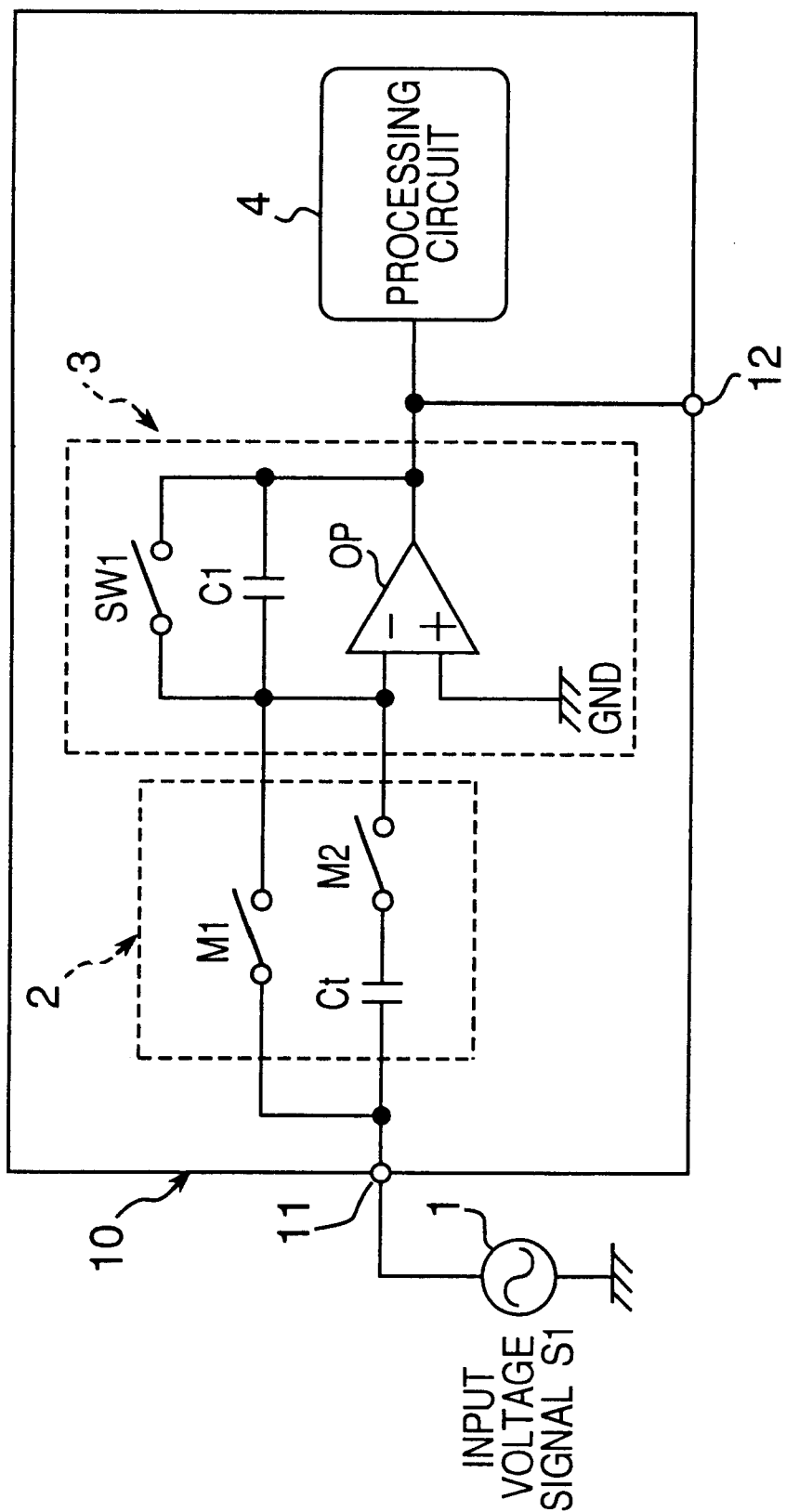
FIG. 1 shows a circuit diagram of a semiconductor device according to a first embodiment of the present invention.

Semiconductor devices of the present invention will be described in detail below on the basis of embodiments thereof shown in the drawings.

FIG. 1 shows a circuit diagram of a semiconductor device with a built-in minute charge detecting circuit according to a first embodiment of the present invention. This semiconductor inspecting device has a charge transforming capacitance Ct whose one terminal is connected to an input terminal 11, a second switch M2 whose one terminal is connected to the other terminal of the charge transforming capacitance Ct, a first switch M1 connected across the other terminal of the second switch M2 and the input terminal 11, a differential amplifier OP whose inverted input terminal is connected to the other terminal of the second switch M2 and whose non-inverted input terminal is connected to a ground GND, a charge detecting capacitance C1 connected across the output terminal of the differential amplifier OP and the inverted input terminal of the differential amplifier OP, a charge-discharging switch SW1 connected across the output terminal of the differential amplifier OP and the inverted input terminal of the differential amplifier OP, and a processing circuit 4 for processing an output signal outputted from the differential amplifier OP.

A test circuit 2 is constructed of the charge transforming capacitance Ct and the first and second switches M1 and M2. A minute charge detecting circuit 3 is constructed of the differential amplifier OP, the charge detecting capacitance C1 and the charge-discharging switch SW1. An operation mode switchover means is constructed of the first and second switches M1 and M2.

In a normal operation mode of the semiconductor device of the above-mentioned construction, an electric charge signal Q1 is given directly to the charge detecting capacitance C1 from the input signal source 1 when the first switch M1 is turned on in a turned-off state of the charge-discharging switch SW1. Since the electric charge signal Q1 is accumulated in the charge detecting capacitance C1 via the first switch M1, an output voltage Vo of the differential amplifier OP becomes:

$$Vo=Q1/C1.$$

This consequently enables detection of the charge quantity of the electric charge signal Q1. An electric charge of the charge detecting capacitance C1 is discharged by turning on the charge-discharging switch SW1, so that the minute charge detecting circuit 3 is initialized to establish a state for measurement of a next charge quantity. As described above, even with the built-in test circuit 2, the minute charge detection in the normal operation mode can be achieved.

In a test operation mode, firstly, the first switch M1 and the charge-discharging switch SW1 are turned off and the second switch M2 is turned on. In this state, an input voltage signal S1 from the input signal source 1 is applied to the input terminal 11. Then, the first switch M1 and the charge-discharging switch SW1 are turned on to reset the charge quantities of the charge transforming capacitance Ct and the charge detecting capacitance C1. Subsequently, the first switch M1 and the charge-discharging switch SW1 are turned off. A voltage variation ΔVi of the input voltage signal S1 obtained after the resetting is transformed into an electric charge Qi by the charge transforming capacitance Ct, so that the electric charge Qi expressed by:

$$Qi=Ct\times\Delta Vi$$

is accumulated in the charge detecting capacitance C1. This electric charge Qi is outputted from the minute charge detecting circuit 3 as an output voltage Vo expressed by:

$$Vo=Qi/C1.$$

Measurement of the output voltage Vo at an output voltage measurement terminal 12 enables inspection of the minute charge detecting circuit 3. The output voltage Vo is also expressed by the charge transforming capacitance Ct for transforming the input voltage signal S1 into a minute electric charge, the charge detecting capacitance C1 of the minute charge detecting circuit 3 and the voltage variation ΔVi of the input voltage signal S1 as follows:

$$Vo=\Delta Vi\times(Ct/C1).$$

With this equation, the voltage variation ΔVi of the input voltage signal S1 and the output voltage Vo are determined on the basis of a ratio of a capacitance value of the charge transforming capacitance Ct for transforming the input voltage variation into the minute electric charge with respect to the capacitance value of the charge detecting capacitance C1 of the minute charge detecting circuit 3. By making the capacitance value of the charge transforming capacitance Ct smaller than the capacitance value of the charge detecting capacitance C1, the voltage value of the voltage variation ΔVi of the input voltage signal S1 for giving the minute electric charge can be increased. Therefore, the fluctuation of the input voltage signal S1 by the influence of the external noises can be reduced, and thereby the inspection accuracy is improved.

Moreover, similarly to the minute charge detecting circuit 3, the charge transforming capacitance Ct and the second and third switches M2 and M3 are built within the semiconductor device in this embodiment. Therefore, a stray capacitance added to an input section of the minute charge detecting circuit 3 has a minute capacitance value of only the stray capacitance inside the semiconductor device because no external measurement circuits exert influence on the stray capacitance. Therefore, the input charge quantity given to the minute charge detecting circuit 3 is not reduced by the influence of the external measurement circuits, by which no error occurs in measuring the gain of the minute charge detecting circuit 3.

By thus providing the test circuit 2 between the input terminal 11 and the minute charge detecting circuit 3, it is not required to externally input the minute electric charge which is susceptible to the influence of noises during inspection and the external stray capacitance. This enables improvement of accuracy in measurement and achievement of stable inspection or test. Moreover, external inspection circuits can also be simplified, so that occurrence of various problems in the mass-production line and the like can also be suppressed.

Figure 2:
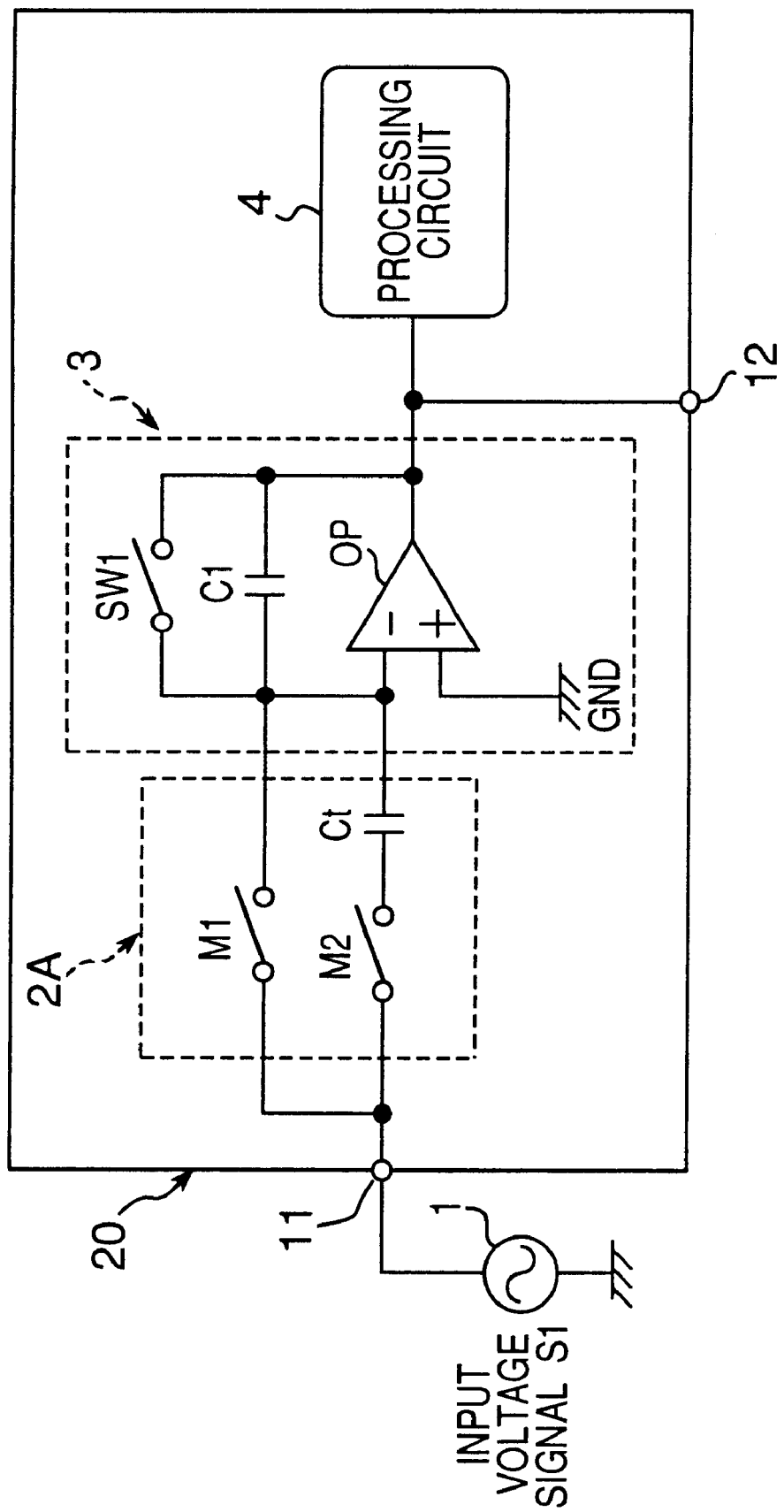
FIG. 2 shows a circuit diagram of a semiconductor device according to a second embodiment of the present invention.

FIG. 2 is a circuit diagram of a semiconductor device with a built-in minute charge detecting circuit according to a second embodiment of the present invention.

This semiconductor inspecting device has the same construction as that of the semiconductor inspecting device of the first embodiment except for the position where the second switch M2 is connected. In the second embodiment, the same components as those of the first embodiment are denoted by the same reference numerals and no description is provided for them.

A second switch M2 of the second embodiment is arranged between an input terminal 11 and a charge transforming capacitance Ct while the second switch M2 of the first embodiment is arranged between the charge transforming capacitance Ct and the input section of the minute charge detecting circuit 3. Specifically, in the semiconductor device of the second embodiment, one terminal of the second switch M2 is connected to the input terminal 11 and the other terminal of the second switch M2 is connected to one terminal of the charge transforming capacitance Ct as shown in FIG. 2. A test circuit 2A is constructed of the charge transforming capacitance Ct, a first switch M1 and the second switch M2.

The semiconductor device of this second embodiment has operations and effects similar to those of the semiconductor device of the first embodiment.

Figure 3:
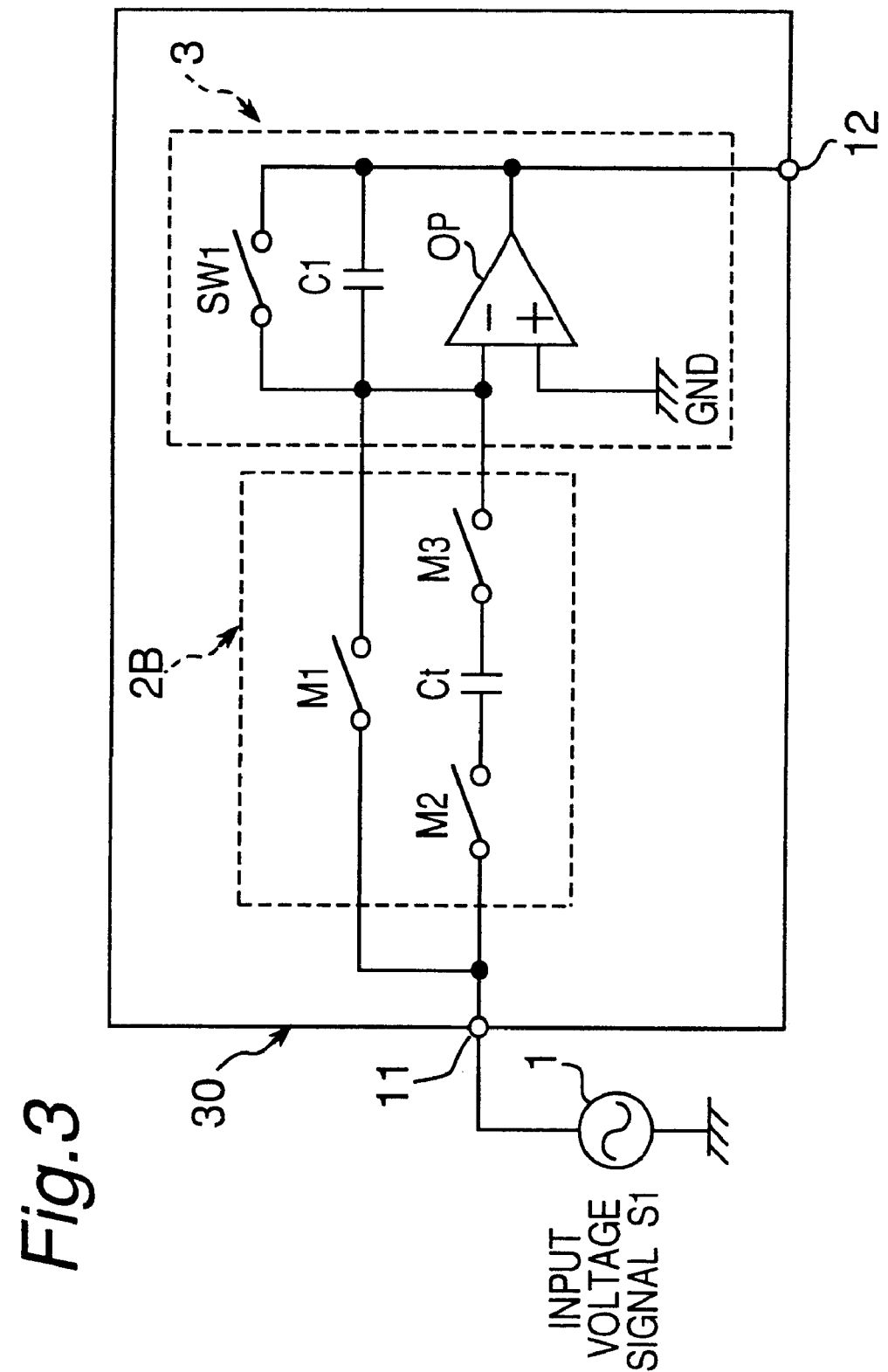
FIG. 3 shows a circuit diagram of a semiconductor device according to a third embodiment of the present invention.

FIG. 3 is a circuit diagram of a semiconductor device with a built-in minute charge detecting circuit according to a third embodiment of the present invention.

This semiconductor inspecting device is formed in combination of the semiconductor inspecting devices according to the first and second embodiments. In the third embodiment, the same components as those of the first and second embodiments are denoted by the same reference numerals and no description is provided for them.

This semiconductor inspecting device has a second switch M2 whose one terminal is connected to an input terminal 11, a charge transforming capacitance Ct whose one terminal is connected to the other terminal of the second switch M2, a switch M3 whose one terminal is connected to the other terminal of the charge transforming capacitance Ct, a first switch M1 connected across the other terminal of the switch M3 and the input terminal 11, a differential amplifier OP whose inverted input terminal is connected to the other terminal of the switch M3 and whose non-inverted input terminal is connected to a ground GND, a charge detecting capacitance C1 connected across an output terminal of the differential amplifier OP and the inverted input terminal of the differential amplifier OP, and a charge-discharging switch SW1 connected across the output terminal of the differential amplifier OP and the inverted input terminal of the differential amplifier OP.

A test circuit 2B is constructed of the charge transforming capacitance Ct and the first, second and third switches M1, M2 and M3. A minute charge detecting circuit 3 is constructed of the differential amplifier OP, the charge detecting capacitance C1 and the charge-discharging switch SW1. An operation mode switchover means is constructed of the first, second and third switches M1, M2 and M3. It is to be noted that a processing circuit for processing an output voltage outputted from the differential amplifier OP is not shown.

Figure 4:
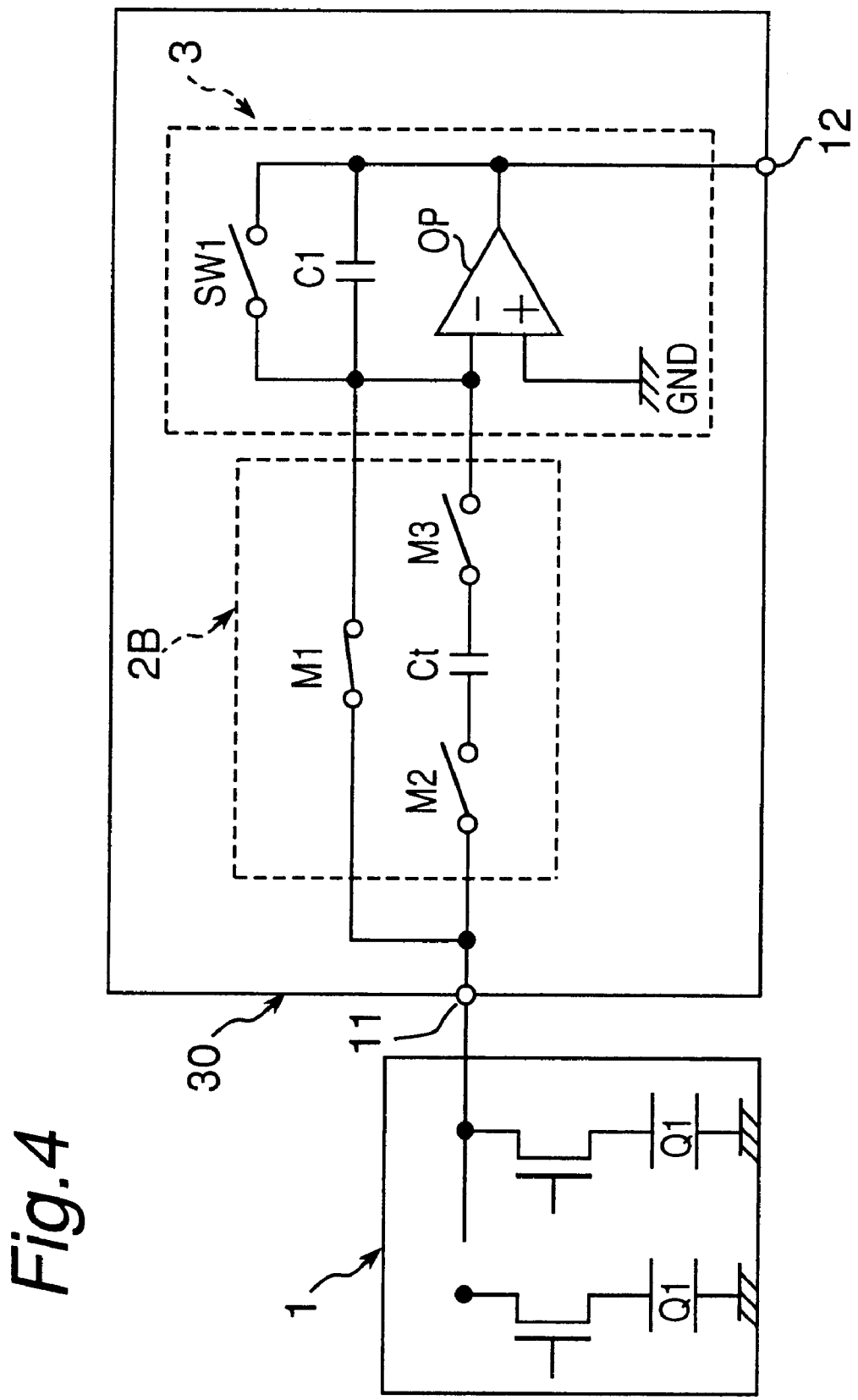
FIG. 4 shows a circuit diagram in a normal operation mode of the semiconductor device according to the third embodiment of the present invention.

In the normal operation mode of the semiconductor device of the above-mentioned construction, the first switch M1 is turned on in a state that the second and third switches M2, M3 and the charge-discharging switch SW1 are turned off as shown in FIG. 4, and thereby the electric charge signal Q1 is directly given from the input signal source 1 to the charge detecting capacitance C1. This electric charge signal Q1 is accumulated in the charge detecting capacitance C1 and the output voltage Vo expressed by:

$$Vo=Q1/C1$$

is outputted. This consequently enables detection of charge quantity of the electric charge signal Q1. An electric charge of the charge detecting capacitance C1 is discharged by turning on the charge-discharging switch SW1. Thereby, the minute charge detecting circuit 3 is initialized to establish a measurement state of a next electric charge. As described above, even with the built-in test circuit 2B, the minute charge detection in the normal operation mode can be achieved.

Figure 5:
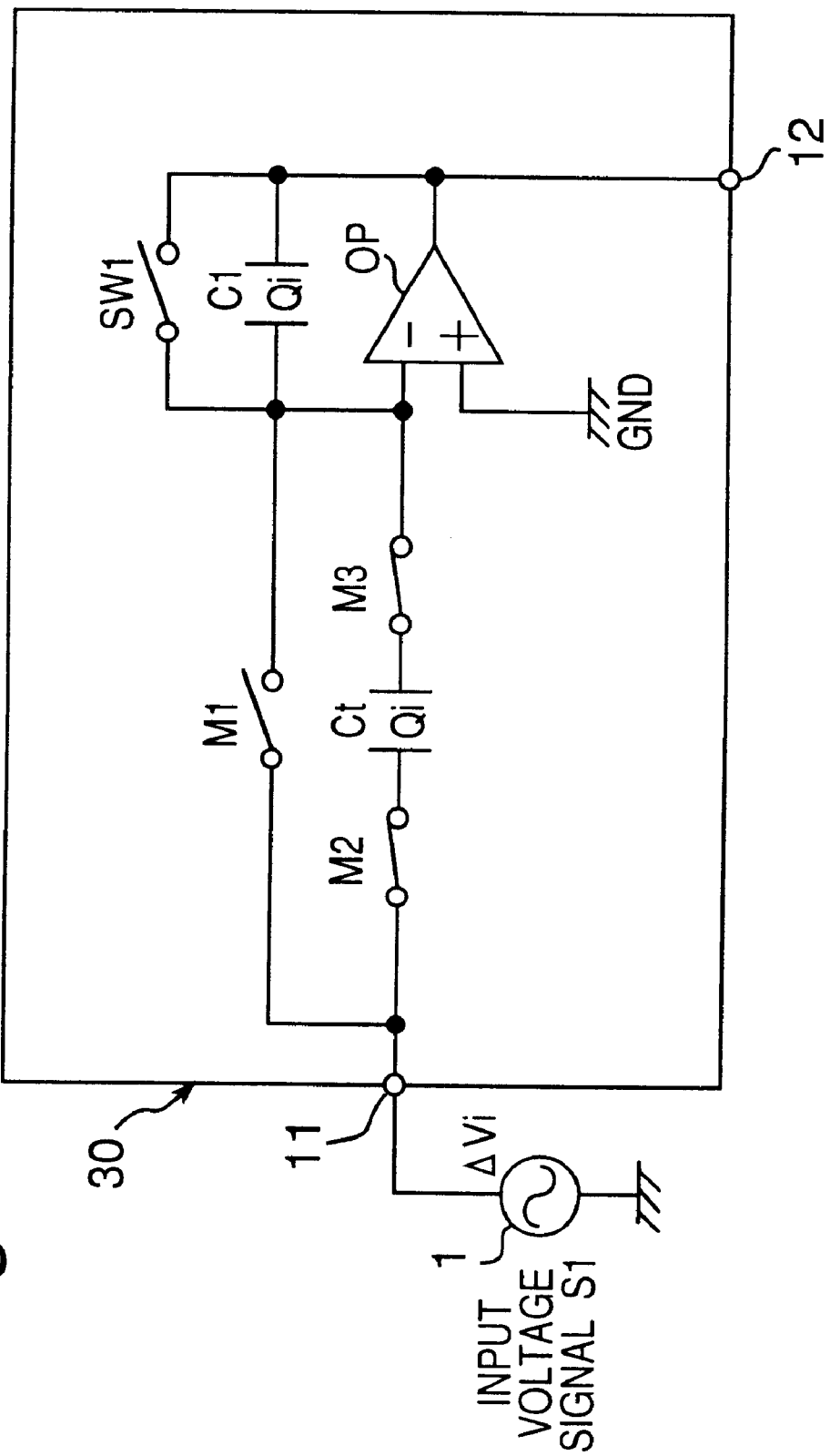
FIG. 5 shows a circuit diagram in a first test operation mode of the semiconductor device according to the third embodiment of the present invention.

In the test operation mode, firstly, the first switch M1 and the charge-discharging switch SW1 are turned off and the second and third switches M2 and M3 are turned on as shown in FIG. 5. In this state, an input voltage signal S1 from the input signal source 1 is applied to the input terminal 11. Then, the first switch M1 and the charge-discharging switch SW1 are turned on to reset the charge quantities of the charge transforming capacitance Ct and the charge detecting capacitance C1. Subsequently, the first switch M1 and the charge-discharging switch SW1 are turned off. A voltage variation ΔVi of the input voltage signal S1 obtained after the resetting is transformed into an electric charge Qi by the charge transforming capacitance Ct. The electric charge Qi expressed by,:

$$Qi=Ct \times \Delta Vi$$

is accumulated in the charge detecting capacitance C1. This electric charge Qi is outputted from the minute charge detecting circuit 3 as the output voltage Vo expressed by:

$$Vo=Qi/C1.$$

Measurement of the output voltage Vo at an output voltage measurement terminal 12 enables inspection of the minute charge detecting circuit 3. The output voltage Vo is also expressed by the charge transforming capacitance Ct for transforming the input voltage signal S1 into a minute electric charge, the charge detecting capacitance C1 of the minute charge detecting circuit 3 and the voltage variation ΔVi of the input voltage signal S1 as follows:

$$Vo=\Delta Vi \times (Ct/C1).$$

With this equation, the voltage variation ΔVi of the input voltage signal S1 and the output voltage Vo are determined on the basis of a ratio of a capacitance value of the charge transforming capacitance Ct for transforming the input voltage variation into the minute electric charge with respect to the capacitance value of the charge detecting capacitance C1 of the minute charge detecting circuit 3. By making the capacitance value of the charge transforming capacitance Ct smaller than the capacitance value of the charge detecting capacitance C1, the voltage value of the voltage variation ΔVi of the input voltage signal S1 for giving the minute electric charge can be increased. Therefore, the fluctuation of the input voltage signal S1 by the influence of the external noises can be reduced, and thereby the inspection accuracy is improved.

Moreover, similarly to the minute charge detecting circuit 3, the charge transforming capacitance Ct and the second and third switches M2 and M3 are built within the semiconductor device in this embodiment. Therefore, a stray capacitance added to an input section of the minute charge detecting circuit 3 has a minute capacitance value of only the stray capacitance inside the semiconductor device because no external measurement circuits exert influence on the stray capacitance. Therefore, the input charge quantity given to the minute charge detecting circuit 3 is not reduced by the influence of the external measurement circuits, by which no error occurs in measuring the gain of the minute charge detecting circuit 3.

Figure 6:
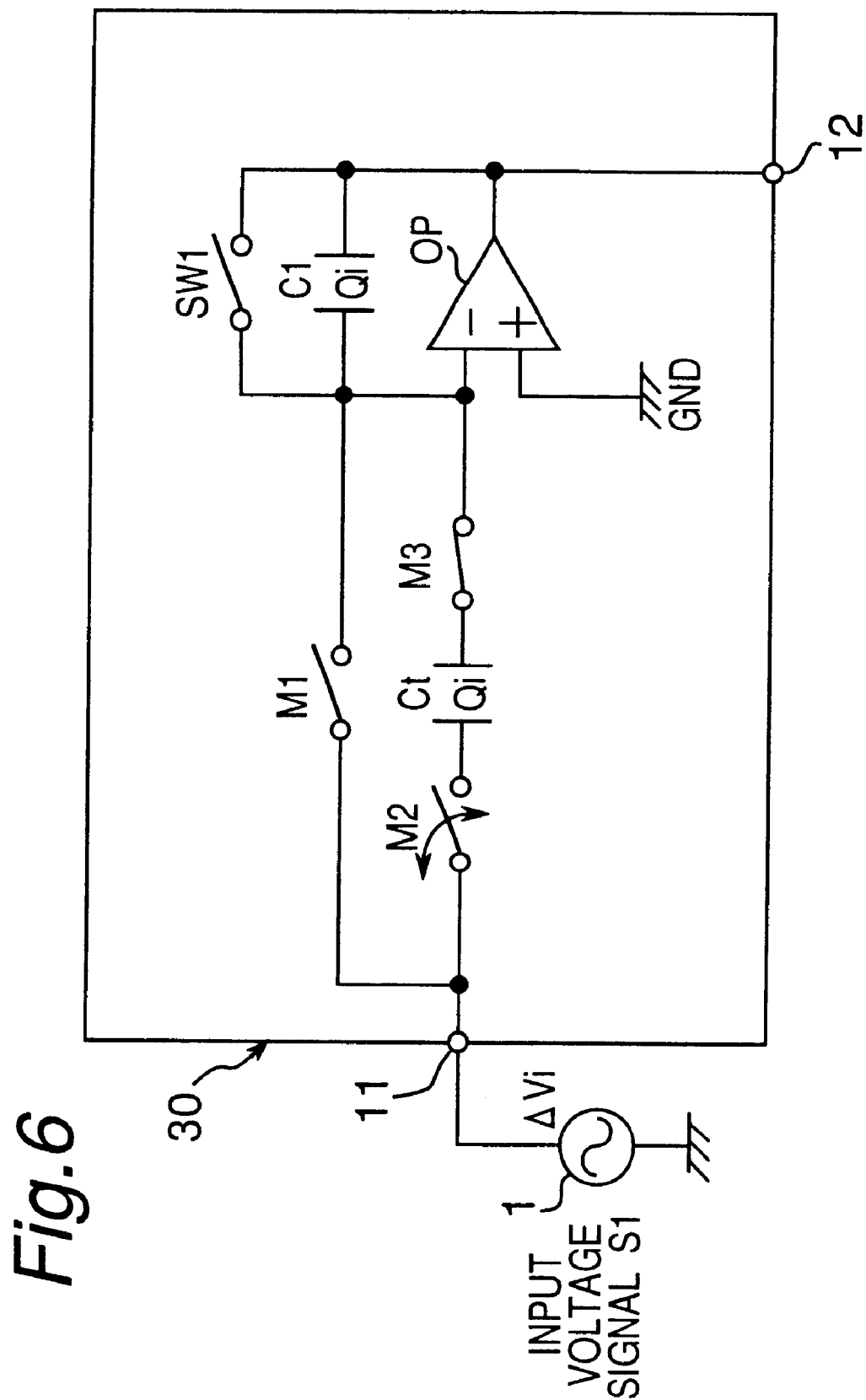
FIG. 6 shows a circuit diagram in a second test operation mode of the semiconductor device according to the third embodiment of the present invention.
Figure 7:
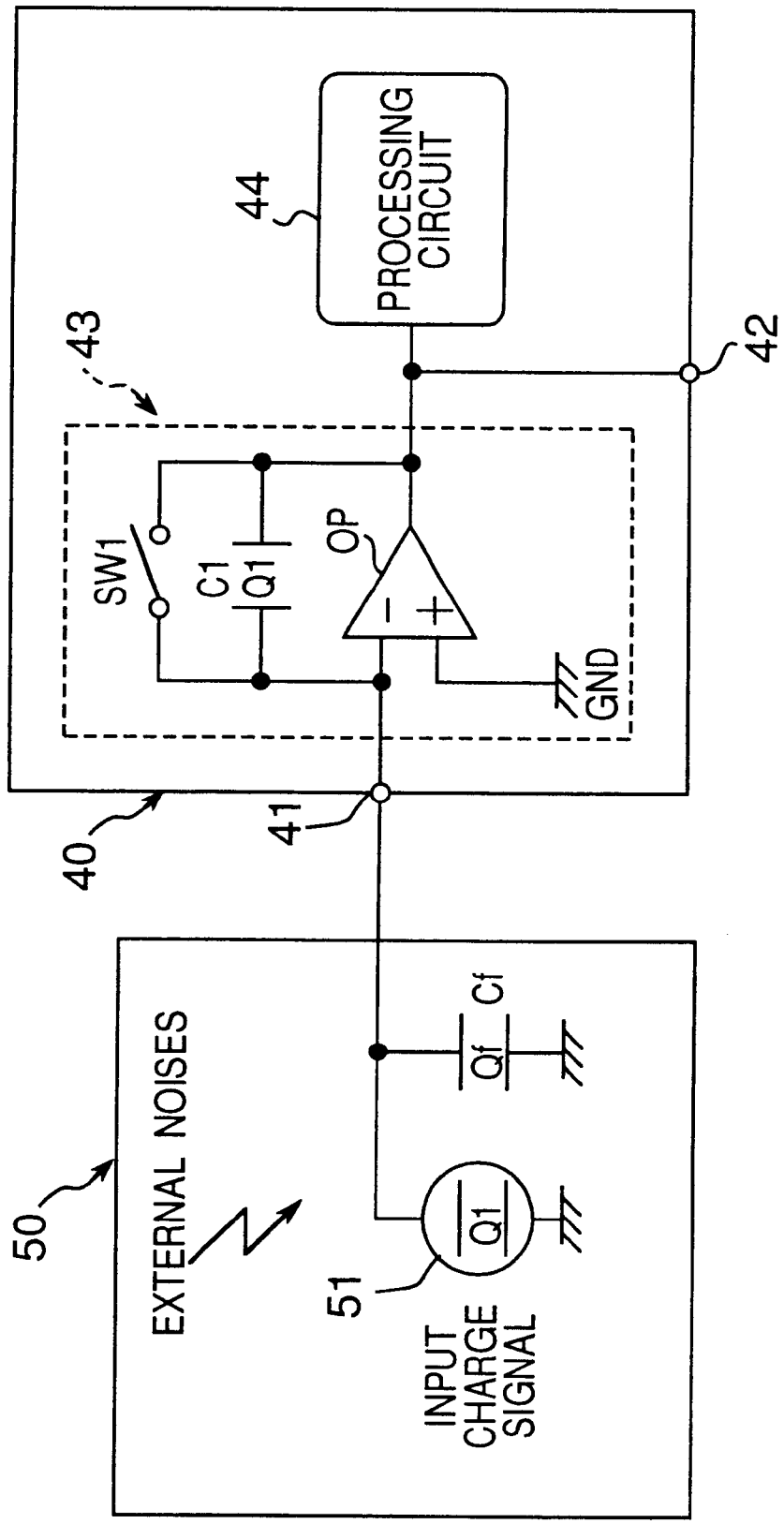
FIG. 7 shows a circuit diagram of a prior art semiconductor device.

Next, as shown in FIG. 6, in the case where the voltage variation ΔVi of the input voltage signal S1 is applied to the input terminal 11 so that the charge transforming capacitance Ct transforms the voltage variation ΔVi into a minute electric charge Qi to accumulate the minute electric charge Qi in the charge transforming capacitance Ct, it is possible to sample the input voltage signal S1 by turning on the second switch M2 during the period when the electric charge is given by the input voltage signal S1 and turning off the second switch M2 during the period when the electric charge is not given. By this sampling operation, noises of the input voltage signal S1 can be reduced by not sampling a portion of the input voltage signal S1 in which noises are generated, and this also enables improvement of the measurement accuracy with the noise reduction at the time of inspection.

In the first through third embodiments, there has been described the semiconductor device provided with the minute charge detecting circuit 3 which is constructed of the differential amplifier OP, the charge detecting capacitance C1 and the charge-discharging switch SW1. However, construction of the minute charge detecting circuit is not limited to the above-mentioned.

In the first and second embodiments, the operation mode switchover means is constructed of the first and second switches M1 and M2. In the third embodiment, the operation mode switchover means is constructed of the first, second and third switches M1, M2 and M3. However, the operation mode switchover means is not limited to those. The operation mode switchover means may have any other circuit constructions if they can switch over between the normal operation mode in which the electric charge inputted to the input terminal is detected by the minute charge detecting circuit and the test operation mode in which the voltage signal inputted to the input terminal is transformed into an electric charge by the charge transforming capacitance and the transformed electric charge is detected by the minute charge detecting circuit.

As is apparent from the above, according to the semiconductor device of the present invention, by integrating the test circuit into the semiconductor inspecting device provided with the minute charge detecting circuit, the influence of the stray capacitance due to the external measurement circuit can be eliminated, and the external input signal can be reduced in impedance for the reduction in the influence of the measurement signal or the external noises. The above arrangement enables stabilization of measurement level and improvement of measurement accuracy. The above arrangement also enables simplification of external measurement circuits and reduction of troubles in mass-production.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor device comprising:
   a minute charge detecting circuit for detecting a minute electric charge; and
   a test circuit provided between an input terminal of the semiconductor device and an input section of the minute charge detecting circuit, the test circuit having:
   a charge transforming capacitance for transforming a voltage signal inputted from the input terminal into an electric charge; and
   an operation mode switchover means for switching over between a normal operation mode in which an electric charge inputted to the input terminal is detected by the minute charge detecting circuit and a test operation mode in which the voltage signal inputted to the input terminal is transformed into an electric charge by the charge transforming capacitance and the transformed electric charge is detected by the minute charge detecting circuit.

2. A semiconductor device as set forth in claim 1, wherein the operation mode switchover means comprises:
   a first switch that has one terminal connected to the input terminal and other terminal connected to the input section of the minute charge detecting circuit; and
   a second switch that has one terminal connected to the charge transforming capacitance and other terminal connected to the input section of the minute charge detecting circuit.

3. A semiconductor device as set forth in claim 1, wherein the operation mode switchover means comprises:
   a first switch that has one terminal connected to the input terminal and other terminal connected to the input section of the minute charge detecting circuit; and
   a second switch that has one terminal connected to the input terminal and other terminal connected to the charge transforming capacitance.

4. A semiconductor device as set forth in claim 1, wherein the operation mode switchover means comprises:
   a first switch that has one terminal connected to the input terminal and other terminal connected to the input section of the minute charge detecting circuit;
   a second switch that has one terminal connected to the input terminal and other terminal connected to the charge transforming capacitance; and
   a third switch that has one terminal connected to the charge transforming capacitance and other terminal connected to the input section of the minute charge detecting circuit.

5. A semiconductor device as set forth in claim 4, wherein the second switch is turned on during a period when an electric charge for test use is given to the minute charge detecting circuit and the second switch is turned off during a period when no electric charge for test use is given to the minute charge detecting circuit in a state that the first and third switches are turned on in the test operation node.

* * * * *